NEGATIVE RESISTANCE AMPLIFIER CIRCUITS

Filed June 22, 1959 3 Sheets-Sheet 1

INVENTOR
H. SEIDEL
BY David P. Kelley
ATTORNEY

June 19, 1962 H. SEIDEL 3,040,267

NEGATIVE RESISTANCE AMPLIFIER CIRCUITS

Filed June 22, 1959 3 Sheets-Sheet 2

INVENTOR
H. SEIDEL
BY David P. Kelley
ATTORNEY

June 19, 1962 H. SEIDEL 3,040,267

NEGATIVE RESISTANCE AMPLIFIER CIRCUITS

Filed June 22, 1959 3 Sheets-Sheet 3

INVENTOR
H. SEIDEL
BY David P. Kelley
ATTORNEY

United States Patent Office 3,040,267
Patented June 19, 1962

3,040,267

NEGATIVE RESISTANCE AMPLIFIER CIRCUITS

Harold Seidel, Fanwood, N.J., assignor to Bell Telephone Laboratories, Incorporated, New York, N.Y., a corporation of New York Filed June 22, 1959, Ser. No. 821,829
18 Claims. (Cl. 330—56)

This invention relates to signal amplifiers, and, more particularly, to signal amplifiers of the negative resistance type.

While, in general, the principles of the present invention are applicable to many types of negative resistance amplifiers, these principles will be most easily understood when considered in conjunction with a variable reactance or parametric type of negative resistance amplifier utilizing semiconductor diodes. Accordingly, the following discussion will deal with such amplifiers; however, it is to be understood that other types of amplifiers are not intended to be excluded.

The phenomenon of parametric amplification through the use of diodes has long been known in the art; however, such amplification, involving a down-conversion of frequency, is extremely noisy, and, hence, of little utility. More recently, however, it has been found that extremely low noise amplification at microwave frequencies can be obtained if the diode parametric amplifier is operated as an up-converter of frequency, or as a negative resistance type of amplifier.

In an article by A. Uhlir, Jr., entitled "Two Terminal P-N Junction Devices for Frequency Conversion and Computation," Proceedings of the I.R.E., volume 44 (1956), page 1183, the up-conversion type of amplifier is explained. Briefly, such an amplifier comprises a nonlinear reactance diode to which are applied signal waves at a given frequency, and "pump" waves at a different, greater frequency. When the circuit containing the diode is tuned to the signal frequency and to the pump frequency plus the signal frequency, amplified power is extracted at the pump plus signal frequency, the noise content of the extracted power being quite small.

In a negative resistance type of diode parametric amplifier, the circuit containing the diode is tuned to the signal frequency, in the simplest case, and to the so-called "image" or "idler" frequency, which is the pump frequency minus the signal frequency. The idler frequency results from the mixing of the signal and pump frequencies in the manner of a modulation process. In such a case, low noise amplification of both the signal and the idler frequencies is obtained. It is with this latter type of parametric amplifier that the present invention is involved.

A semiconductor diode, when used in a negative resistance type amplifier, presents to the incoming signal wave a negative resistance which is shunted by a variable capacitance, the capacitance varying at the pump frequency. For greatest efficiency of operation it is preferable that the signal source, or generator, looking into the diode circuit, see a high impedance. To this end, it has been the practice in the past to tune out the capacitance, which tends to produce a mismatch, by means of one or more reactive elements, such as an inductance in shunt with the capacitance. While such an arrangement has the virtue of increasing the gain of the amplifier, it has the decided disadvantage of narrowing the bandwidth. When a resonant cavity is used in conjunction with the diode, the impedance, and the gain, are materially increased, but the bandwidth is decreased still further. In order to overcome this inverse relationship between gain and bandwidth, resort has been had to a plurality of stages of diode amplifiers, each stage of which is adjusted for large bandwidth and small gain. Because there are a series of such stages, however, the gain is additive, and the system functions as a broadband, high gain, low noise amplifier.

While such an arrangement as just discussed overcomes the main drawback of the single diode amplifier, that is, the substantially constant gain-bandwidth product, it introduces certain disadvantages of its own. Primarily these disadvantages arise from the delicate phase relationships which must be maintained to achieve proper energy interchange and amplification. Parametric amplifiers are inherently sensitive to phase changes between the pump, signal, and idler waves, and adequate performance can only be achieved if the optimum phase relationship is maintained. It is readily apparent that when a plurality of diode amplifiers are arranged in an iterative structure, the pump, signal, and idler waves travel along the structure and must arrive at each successive diode in the proper phase. However, the energy interchange that takes place among the waves results in variations in the relative velocities of the waves, which in turn tends to alter their phase relationship, thereby derogating from the amplification process. A further drawback in an iterative arrangement is the dispersive character of the transmission path which tends to destroy any synchronous relationship among the waves of differing frequencies. A still further drawback to such an arrangement resides in the fact that it is extremely difficult to produce a plurality of diodes possessing identical characteristics, yet it is highly desirable that in an iterative structure they do possess identical characteristics.

It is possible to overcome most of these inherent faults of the iterative or traveling wave type structure, by means of such structures as shown in the copending U.S. patent application Serial No. 787,305, filed January 16, 1959, of R. S. Engelbrecht. However, such arrangements necessitate a certain complexity of structure which it would be desirable to eliminate, or at least minimize.

It is an object of this invention to produce such broadband amplification utilizing only a single diode or amplifying stage as the amplifying element.

These and other objects of this invention are achieved in one illustrative embodiment thereof which comprises a semiconductor diode to which are applied pump wave energy from a pump source and signal wave energy from a signal source. Ideally, the pump frequency is twice the center frequency of the signal. Interconnecting the signal source and the diode is a transmission line which essentially comprises a wide bandpass filter network. Advantageously, the variable capacitance portion of the diode comprises the last stage of capacitance of the filter network.

It is a first feature of my invention that the transmission line is constructed to have a characteristic impedance which is equal in magnitude to, but opposite in sign to, the negative impedance of the diode, and more particularly, to the negative resistance thereof. In order that the signal generator may be matched into the transmission line, there is provided an impedance matching transformer between the signal source and the transmission line. In order to prevent spontaneous oscillations, this transformer advantageously does not provide a perfect match, there being, preferably, sufficient mismatch to present a small net positive resistance to the signal looking back from the diode, rather than a complete absence of resistance which otherwise would result from the equal but opposite resistances of the line and the diode.

It is another feature of my invention that the characteristics of the transmission line are so chosen as to present to the signal source or generator an impedance characterisitc for the system such that the gain of the system is constant over an exceedingly wide band of frequencies.

It is still another feature of my invention that the bandpass characteristic of the transmission line does not include within the band the pump frequency and for practical purposes substantially none of the upper sideband frequencies.

In a second illustrative embodiment of my invention, the pump frequency is some frequency other than twice the signal frequency, in which case the mean signal and idler frequencies are not equal. In accordance with still another feature of my invention there is provided a second transmission network having a bandpass characteristic centered at the idler frequency, and having characteristics similar to those of the first transmission network.

In another illustrative embodiment of my invention, a plurality of amplifying circuits are cascaded together through the use of circulators to produce over that attainable with a single amplifier circuit either enhanced gain over a wide frequency band, or to produce for the same gain, extremely wideband operation for the system. It is, therefore, another feature of the present invention that a plurality of amplifiers embodying the principles of my invention be interconnected such that their gain or their passbands, or both, are additive.

A complete understanding of this invention and of these and other features thereof may be gained from consideration of the following detailed description in conjunction with the accompanying drawing, in which:

FIG. 1B is a graph illustrating the behavior of the circuit of FIG. 1A;

FIG. 2B is a graph illustrating the behavior of the circuit of FIG. 2A;

Figure 1A:
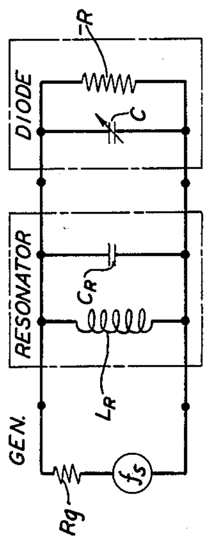
FIG. 1A is a diagrammatic representation of a conventional diode amplifier.
Figure 1A:
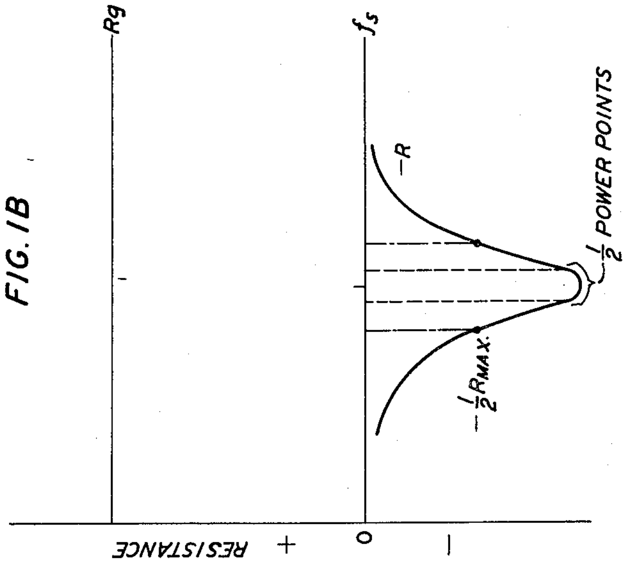

Turning now to FIG. 1A, there is shown a diagrammatic representation of a conventional semiconductor diode parametric amplifier circuit. For purposes of the discussion and analysis to follow, it is sufficient to represent the diode as a negative resistance, —R, shunted by a variable capacitance, C, although, in actuality, this is not a perfect representation. It is to be understood that the representation of the capacitance, C, as being variable implies the presence of a pump source, which, for simplicity, has not been shown. Additionally, to simplify the analysis to follow, the degenerate case of parametric amplification is assumed. By "degenerate" is meant the case where the pump frequency is substantially twice the center signal frequency, in which case the center idler frequency is equal to the center signal frequency.

Connected to the diode is a resonant circuit comprising an inductance $I_R$ and a capacitance $C_R$. In practice, the resonant circuit comprises, in general, a resonant cavity resonant at the signal frequency, within which the diode is mounted. The resonator serves to tune out the mismatching effects of the static value of the capacitance. The dynamic, or varying values of C are reflected in the negative resistance characteristic of the diode. In addition, the resonator presents to the signal generator a high impedance. The signal generator is shown as having a resistance $R_g$ which is effectively in series between the generator and the remainder of the circuit.

In FIG. 1B there is shown a graph of the behavior of the circuit of FIG. 1A. The graph of FIG. 1B is a plot of resistance as the ordinate versus signal frequency as the abscissa. The generator resistance $R_g$ is shown as a constant value on the graph, inasmuch as this resistance does not vary with frequency. The negative resistance (—R) curve of the diode is depicted on the graph as a peaked curve below the abscissa. This is the resistance variation with frequency that the generator sees looking into the circuit containing the diode. It can readily be appreciated that maximum gain occurs at the negative peak of the —R curve, and falls off rapidly to either side of this peak. This decrease in gain is so abrupt that the 3 decibel (half-power) points, which define the bandwidth, occur after only a slight change in frequency; thus it can be seen that the bandwidth is quite narrow. This frequency band is depicted on the graph as the range of frequencies between the two dash lines, which extend from the half-power points to the abscissa.

Theoretically, as long as the diode displays a negative resistance, amplification is obtainable. It can be seen from the graph of FIG. 1B that only a very minute portion of the frequency range over which the diode resistance is negative is utilized. It is also readily apparent that at the points on the —R curve which correspond to $-\frac{1}{2}R_{max}$, a very much greater band of frequencies, as depicted by the dot-dash lines on the graph, is involved, but the gain has fallen off to a point of nonusability.

Figure 2A:
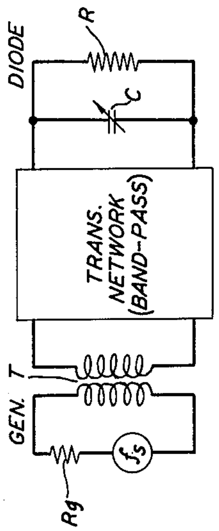
FIG. 2A is a diagrammatic representation of an amplifier circuit embodying the principles of the present invention.
Figure 2A:
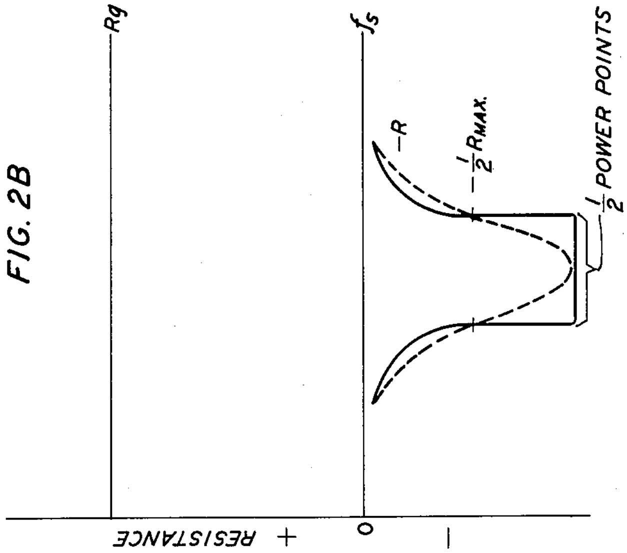
Figure 2C:
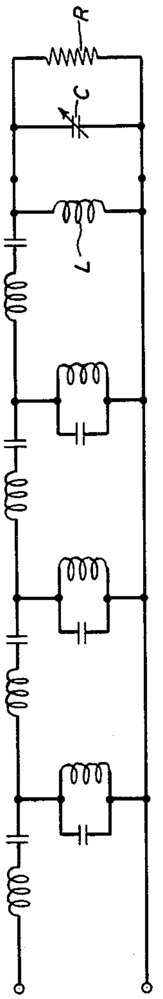
FIG. 2C is a diagrammatic representation of a portion of the circuit of FIG. 2A.

The present invention is embodied in a circuit which permits fuller utilization of the negative resistance characteristic of the diode to operate over a bandwidth corresponding, for example, to that defined by the $-\frac{1}{2}R_{max}$ points, but produces a gain comparable to that between the one-half power points. Turning now to FIG. 2, there is depicted in FIG. 2A a diagrammatic representation of a circuit involving the principles of the present invention, and in FIG. 2B there is depicted a graph corresponding to the graph of FIG. 1B but showing characteristics of the circuit of FIG. 2A. In FIG. 2C there is shown a portion, in greater detail, of the circuit of FIG. 2A.

In the circuit of FIG. 2A, there is shown interposed between the generator and the diode a transmission network having a bandpass characteristic instead of the resonant characteristic of the circuit of FIG. 1A. In accordance with the principles of my invention, this network is designed to have a characteristic impedance R which is equal to, but opposite in sign to, the value of —R of the diode. In the Radio Engineers Handbook by F. E. Terman, 1st Edition, 1943, at page 183, the sending end impedance of a transmission line is given in equation 57. From this equation it can be shown that if $Z_L$ is made equal to $Z_O$ but of opposite sign, the sending end impedance, that is, the impedance the generator sees, is equal to $-Z_O$. In the circuit of FIG. 2A, therefore, the generator, which is matched through a transformer to the input impedance of the transmission network, will see as the input impedance —R, and as long as the characteristic impedance remains equal to and opposite in sign to the diode resistance, this input impedance will be independent of frequency variations. To this end, the transmission network is designed to have a characteristic impedance which varies with variations in the negative resistance of the diode due to frequency changes. In FIG. 2C there is shown diagrammatically the configuration that the transmission network takes to meet this requirement. It can readily be observed that the configuration is that of a bandpass filter network. It is possible, with such a network, to produce a characteristic impedance which follows the variations of the diode resistance within certain limits. Beyond these limits, however, the manipulation of the circuit parameters becomes unwieldy. I have found that a relatively simple circuit of the configuration shown in FIG. 2C follows the variations in the diode negative resistance between the ½ R points, or even between more widely spaced points. As a result, between the ½ R points, the diode, looking through the filter network toward the generator in effect does not see the filter network, since the diode and the filter network are matched, and instead, sees only the constant resistance $R_g$ of the generator which is matched through the transformer T. Since in any transmission line having matched terminals reciprocity prevails, in the figure of 2C the generator is "fooled" into seeing a constant negative resistance, and, consequently, a constant gain. This effect is depicted in FIG. 2B, where it is readily apparent that over a wide band of frequencies there is a substantially constant value of negative resistance. For comparison, the —R curve of FIG. 1B is shown superimposed in dash lines. It is readily apparent that there is a large increase in bandwidth between the one-half power points where the negative resistance, and hence the gain, is constant.

In actual practice, inasmuch as the impedances of the transmission network and the diode are equal and opposite over the frequency band of interest, it is preferable to have, at transformer T, a slight mismatch between the generator and the remainder of the circuit. Such a mismatch has the effect of preventing the system from breaking into oscillations, and a reasonable degree of mismatch can be tolerated without materially affecting the amplification of the system. Obviously without this mismatch the device will function as an amplifier having infinite gain and therefore will be unstable and commence to oscillate.

Thus far, the effect of the variable capacitance of the diode has not been discussed. In FIG. 2C it can be seen that this capacitance C is shunted by an inductance L and effectively the two comprise the last stage of the transmission network. In this manner the mismatching effects of the capacitance are minimized and actual use is made of the capacitance as a filter element in addition to its normal function as a variable reactance.

The abstraction and utilization circuits for the arrangement of FIG. 2A have purposely not been shown in the interests of simplicity. In practice, a circulator is generally placed between the transformer T and the transmission network, permitting the signal from the generator to pass through the transmission network, but preventing the amplified signal, which also passes through the network, from returning to the generator. Instead, the amplified signal is abstracted by the circulator and fed to a utilization network.

The characteristics of the transmission network are such that it will not pass the pump frequency waves. As a consequence, the pump waves, which are fed directly to the diode, are, in effect, trapped at the diode and do not reach the utilization circuit or the signal generator. It is, therefore, unnecessary to build special filtering circuits for separating the pump and the signal.

The foregoing description is a very simplified analysis of the underlying principles of the present invention. It can be shown through the use of the well known Smith Impedance Chart that the results obtained with the present invention are as indicated in the foregoing analysis. Such use of the Smith chart has been purposely avoided here inasmuch as the analysis becomes quite complicated and involved.

In the foregoing the degenerate case of the parametric amplifier was analyzed. In the so-called nondegenerate case, that is, the case where the center signal and idler frequencies are not equal, the pump frequency differing materially from twice the signal frequency, exactly the same principles apply, but it becomes necessary to use two transmission networks, one for passing the signal frequencies and the other for passing the idler frequencies. Such an arrangement is shown in FIG. 3.

Figure 3:
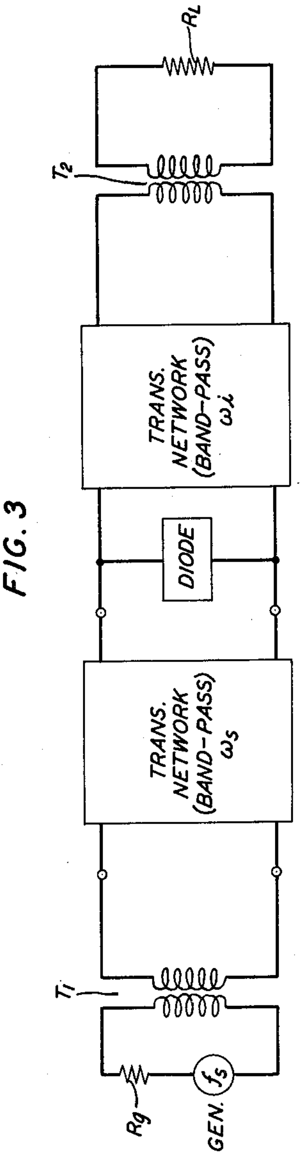
FIG. 3 is a diagrammatic representation of a second amplifier circuit embodying the principles of the present invention.

In FIG. 3, the generator is coupled through a transformer $T_1$ to a transmission network designed to pass the band of signal frequencies, designated $\omega_s$. The transmission network in turn is coupled to the diode and matched thereto in the manner described in the foregoing. The diode is also coupled to a second transmission network designed to match the diode characteristic in exactly the same manner as the first transmission network but also designed to pass a band of idler frequencies, designated $\omega_i$. The second transmission network is matched through a transformer, $T_2$, to a load, designated $R_L$. With such an arrangement, both the generator and the load see the negative resistance of the diode, and the circuit performs in the manner depicted in FIG. 2B.

In the circuit of FIG. 3, the idler, which is amplified along with the signal and contains all of the signal information, may be utilized instead of, or along with, the amplified signal, in which case the load, $R_L$, represents a utilization circuit. Alternatively, the idler may be dissipated in a resistive termination, and the amplified signal abstracted for utilization through a circulator in the manner discussed in connection with FIG. 2A.

Figure 4:
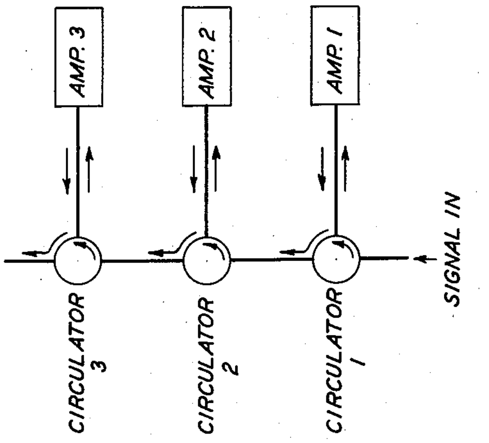
FIG. 4 is a diagrammatic representation of an arrangement of plural amplifiers embodying the principles of the present invention.

From the foregoing, it can readily be appreciated that in accordance with the principles of my invention, unusually broad band, high gain amplification is obtainable. Either the gain or the bandwidth, or both may be increased still further by interconnecting a plurality of amplifiers, embodying the present invention, by means of circulators. In FIG. 4 there is shown such an arrangement. In the arrangement of FIG. 4, the signal to be amplified is fed into circulator 1, which in turn directs it into amplifier 1, which may be either the arrangement of FIG. 2A or FIG. 3. The amplified signal is returned to circulator 1 which directs it to circulator 2, which in turn passes it to amplifier 2. Again the signal is amplified and passed on to amplifier 3 in the foregoing manner, and to subsequent amplifiers or to a utilization circuit. It can be seen that the amplifiers in effect are cascaded, and their gain contribution is additive.

Alternatively, each of the amplifiers may be designed to amplify a different band of frequencies, in which case their passbands are additive, but their gain is not. Such an arrangement permits amplification of extremely wide band signals.

Figure 5:
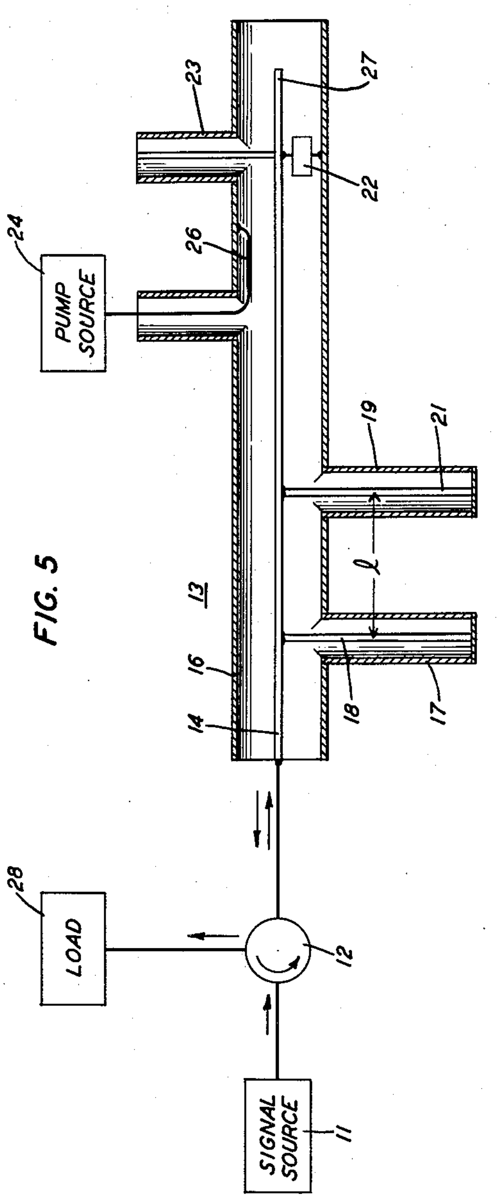
FIG. 5 is a schematic view of a physical embodiment of the circuit of FIG. 2A.

In FIG. 5 there is depicted schematically a physical embodiment of the circuit of FIG. 2A. Signal source 11 supplies a signal to be amplified to a circulator 12 which, in turn, passes the signal to a transmission network 13. Transmission network 13 comprises a length of coaxial cable having an inner conductor 14 and an outer conductor 16. A first short circuited stub 17, which is one quarter wavelength long at one-half the pump frequency, is mounted on the coaxial cable 13, its inner conductor 18 being connected to conductor 14. Spaced from stub 17, a distance *l*, is a second stub 19. The distance *l* is one-quarter wavelength at one-half the pump frequency, as is the length of short circuited stub 19. The inner conductor 21 of stub 19 is connected to conductor 14.

Connected between conductors 14 and 16 is a semiconductor diode 22 which may be of silicon or any other suitable material having the desired properties. The charactertistic impedances of stubs 17 and 19 are adjusted, in a manner well known in the art, to produce the desired characteristics in accordance with the principles of my invention. These adjustments necessarily are dependent upon the type of diode used.

Mounted opposite diode 22 is a stub 23 which is designed to be inductive, and functions in the same manner as the inductance L of FIG. 2C to tune out the static capacitance of the diode 22 and to funtcion, in conjunction with that capacitance, as one stage of the transmission network.

A pump source 24 supplies pumping power to the diode 22 through a conventional loop 26. As was pointed out in the foregoing, the transmission network does not pass the pump frequency, and hence the pump waves are effectively trapped at the diode. This is also true for most of the upper sideband frequencies created through the mixing of the pump and signal frequencies. However, at one or two of these upper side band frequencies the transmission network, because of the resonant characteristics thereof, will permit these frequencies to pass with the signal. To prevent this, there is provided a whip 27 which is preferably one-twelfth of a wavelength long at one-half the pump frequency. This whip acts to suppress those upper sideband frequencies which might otherwise pass through the transmission network. Amplified signals, on the other hand, pass back through the network 13 to circulator 12, which directs them to a utilization circuit or load 28.

The significance of the present invention can readily be appreciated from consideration of the performance of the device of FIG. 5. Utilizing a linearly graded silicon junction diode having a capacitance of 13 micromicrofarads, a center signal frequency of 510 megacycles per second and a pump frequency of 1020 megacycles, the circuit of FIG. 5 produced 14 decibel gain at a bandwidth of 160 megacycles, and 11 decibel gain at a bandwidth of 200 megacycles. Thus the percent bandwidth at 14 decibel gain is approximately 30 and at 11 decibel gain, approximately 40. Prior single diode amplifiers of the negative resistance type produce 14 decibel gain at a bandwidth of 4 megacycles, a bandwidth of approximately 1 percent. It can be seen, therefore, that the present invention produces results which are better than prior art devices by orders of magnitude.

In the foregoing, the principles of the invention have been illustrated with a semiconductor diode as the amplifying element. It is to be understood that these principles are applicable to other types of negative resistance amplifiers, such as masers, and such other amplifiers are not intended to be excluded. Additionally, while the principles of the invention have been illustrated with certain types of circuit arrangements, other types of circuits which might occur to workers in the art are within the purview of this invention and the scope of the appended claims.

What is claimed is:

1. An amplifier circuit comprising, in combination, a source of signals to be amplified, an amplifying element characterized in that it exhibits a negative resistance characteristic which varies with frequency, and a circuit interconnecting said source and said element, said circuit having a characteristic impedance which is equal and opposite in sign to the negative resistance of said element over a wide band of signal frequencies.

2. An amplifier comprising, in combination, a source of signals to be amplified, an amplifying element characterized in that it exhibits a varying negative resistance characteristic over a wide band of frequencies and a reactance characteristic, and circuit means interconnecting said source of signals and said amplifying element, said circuit means having a characteristic impedance which varies with frequency in a manner equal in magnitude and opposite in sign to the negative resistance characteristic of said amplifying element over a wide band of frequencies, said circuit means including the reactance characteristic of said amplifying element as one element thereof.

3. An amplifier according to claim 2 wherein said amplifying element comprises a semiconductor diode.

4. An amplifier according to claim 3 in further combination with means for applying electromagnetic wave energy at a frequency differing from the signal frequencies to said diode.

5. An amplifier comprising, in combination, a source of signals to be amplified, an amplifying element characterized in that it exhibits a varying negative resistance characteristic over a wide band of frequencies, means for applying electromagnetic wave energy at a frequency differing from the center signal frequency to said amplifying element, circuit means interconnecting said signal source and said amplifying element, said circuit means having a characteristic impedance which varies with frequency in a manner equal in magnitude and opposite in sign to the negative resistance characteristic of said amplifying element over a wide band of frequencies centered at the center signal frequency, a utilization device, and circuit means interconnecting said utilization device and said amplifying element, said circuit means having a characteristic impedance which varies with frequency in a manner equal in magnitude and opposite in sign to the negative resistance characteristic of said amplifying element over a wide band of frequencies centered at the difference between the center signal frequency and the frequency of the applied electromagnetic wave energy.

6. An amplifier circuit according to claim 5 wherein the applied electromagnetic wave energy is at a higher frequency than the center signal frequency.

7. An amplifier circuit according to claim 5 wherein said amplifying element is a semiconductor diode.

8. An amplifier circuit comprising, in combination, a source of signals to be amplified, an amplifying element characterized in that it exhibits a negative resistance characteristic which varies with frequency over a band of signal frequencies, a circuit interconnecting said source of signals and said element, said circuit having a characteristic impedance which is equal and opposite in sign to the negative resistance of said element over a wide band of frequencies, and means for abstracting amplified signals for utilization.

9. An amplifier circuit as claimed in claim 8 wherein said means for abstracting the amplified signals comprises a circulator between said source of signals and said interconnecting circuit.

10. An amplifier circuit as claimed in claim 9 wherein said amplifying element is a diode.

11. An amplifier circuit comprising, in combination, a source of signals to be amplified, an amplifying element characterized in that it exhibits a negative resistance characteristic which varies with frequencies over a band of signal frequencies, and a circuit interconnecting said source and said element, said circuit having a characteristic impedance which is equal and opposite in sign to the negative resistance of said element over a wide band of frequencies and comprising a section of coaxial line and a plurality of coaxial stubs connected to said coaxial line, said amplifying element being connected between the inner and outer conductors of said coaxial line at a point further removed from said source than said coaxial stubs.

12. An amplifier circuit according to claim 11 and further including means between said amplifying element and the coaxial stub nearest the amplifying element for applying pump energy to said coaxial line.

13. An amplifier circuit according to claim 12 wherein each of said coaxial stubs is one-quarter wavelength long at one-half the pump frequency.

14. An amplifier circuit according to claim 12 and further including an inductive element adjacent said amplifying element.

15. An amplifier circuit comprising, in combination, a source of signals to be amplified, an amplifying element characterized in that it exhibits a negative resistance characteristic which varies with frequency, and a circuit interconnecting said source and said element, said circuit having a characteristic impedance which is equal and opposite in sign to the negative resistance of said element over a wide band of frequencies, said circuit comprising a length of coaxial line having a plurality of coaxial stubs mounted thereon, said amplifying element being connected between the inner and outer conductors of said line at a point more remote from said source of signals than said coaxial stubs, means between said amplifying element and the nearest of said stubs to said amplifying element for applying pump energy to said coaxial line, and means between said coaxial line and said source of signals for abstracting amplified signals from said circuit.

16. An amplifier circuit according to claim 15 wherein means for abstracting signals comprises a circulator.

17. In combination, a source of signals to be amplified and a plurality of amplifier circuits, each of said amplifier circuits comprising an amplifying element characterized in that it exhibits a negative resistance characteristic which varies with frequency, and a circuit having a characteristic impedance which is equal and opposite in sign to the negative resistance of said element over a wide band of signal frequencies, and means for connecting each of said amplifier circuits in cascade, said means comprising a plurality of circulators.

18. The combination according to claim 17 in which each of said amplifying circuits amplifies a different band of signal frequencies.

References Cited in the file of this patent

UNITED STATES PATENTS

| | | |
|---|---|---|
| 2,522,395 | Ohl | Sept. 12, 1950 |
| 2,585,571 | Mohr | Feb. 12, 1952 |
| 2,652,501 | Wilson | Sept. 15, 1953 |
| 2,666,816 | Hunter | Jan. 19, 1954 |
| 2,719,223 | Van Der Ziel et al. | Sept. 27, 1955 |
| 2,737,601 | McMahon | Mar. 6, 1956 |
| 2,752,559 | Lipkin | June 26, 1956 |